United States Patent [19]

Leung et al.

[11] Patent Number: 5,563,762

[45] Date of Patent: Oct. 8, 1996

[54] CAPACITOR FOR AN INTEGRATED CIRCUIT AND METHOD OF FORMATION THEREOF, AND A METHOD OF ADDING ON-CHIP CAPACITORS TO AN INTEGRATED CIRCUIT

[75] Inventors: Pak K. Leung, Kanata; Ismail T. Emesh, Cumberland, both of Canada

[73] Assignee: Northern Telecom Limited, Montreal, Canada

[21] Appl. No.: 348,849

[22] Filed: Nov. 28, 1994

[51] Int. Cl.$^6$ .................................................. H01G 4/30
[52] U.S. Cl. .................... 361/301.4; 361/306.1; 361/311; 361/312; 361/313; 257/295; 257/296; 257/303; 257/306; 257/310; 437/60
[58] Field of Search .................... 361/304.1, 321, 361/306.1, 306.3, 311, 312, 313, 322; 257/295, 296, 306, 307, 308, 309; 29/25.42; 437/60

[56] References Cited

U.S. PATENT DOCUMENTS

| 4,149,301 | 4/1979 | Cook . | |
|---|---|---|---|
| 5,055,906 | 10/1991 | Mase et al. | 357/54 |

FOREIGN PATENT DOCUMENTS

| 0380326A2 | 1/1990 | European Pat. Off. . | |
|---|---|---|---|
| 0525650A2 | 7/1992 | European Pat. Off. . | |
| 0516031A1 | 12/1992 | European Pat. Off. | 257/296 |
| 0574275A1 | 6/1993 | European Pat. Off. . | |
| 2495837 | 12/1980 | France . | |
| 1-0282371 | 10/1989 | Japan | H01L 29/788 |

OTHER PUBLICATIONS

IEEE Electron Device Letters, vol. 14, No. 7, 1 Jul. 1993, pp. 320–322, XP 000382279 LIU W T et al "Low–Temperature Fabrication of Amorphous BATIO3 Thin–Film Bypass Capacitors".

Primary Examiner—Leo P. Picard
Assistant Examiner—Anthony Dinkins
Attorney, Agent, or Firm—Angela C. de Wilton

[57] ABSTRACT

A capacitor structure and method of forming a capacitor structure for an integrated circuit is provided. The capacitor structure, comprising a bottom electrode, capacitor dielectric and top electrode, is formed on a passivation layer overlying the interconnect metallization. The capacitor electrodes are interconnected to the underlying integrated circuit from underneath, through conductive vias, to the underlying interconnect metallization. The method provides for adding capacitors to an otherwise completed and passivated integrated circuit. The structure is particularly applicable for ferroelectric capacitors. The passivation layer acts as a barrier layer for a ferroelectric dielectric. Large area on-chip capacitors may added without affecting the interconnect routing or packing density of the underlying devices, and may be added almost independently of the process technology used formation of the underlying integrated circuit.

23 Claims, 7 Drawing Sheets

5,563,762

CAPACITOR FOR AN INTEGRATED CIRCUIT AND METHOD OF FORMATION THEREOF, AND A METHOD OF ADDING ON-CHIP CAPACITORS TO AN INTEGRATED CIRCUIT

FIELD OF THE INVENTION

This invention relates to capacitor for an integrated circuit, a method of formation thereof, and a method of adding on-chip capacitors to an integrated circuit.

BACKGROUND OF THE INVENTION

The integration of high value capacitors in integrated circuits is limited by the fact that conventional high value capacitors take up a large areas of on integrated circuit chip, and severely restrict interconnect routing in the region of the capacitor, thus reducing the device packing density and layout efficiency. Many applications, including telecommunications equipment, require a large number of capacitors, e.g. as coupling/decoupling capacitors and for filters. Often, these must be incorporated as discrete off-chip components, substantially increasing the bulk of the peripheral circuitry. In view of increasing demand for compact lightweight portable electronic equipment, e.g. wireless phones, it is desirable that the number of discrete components are reduced.

The minimum dimensions of integrated circuit capacitors are determined primarily by the relatively low dielectric constant (e<10), of conventional capacitor dielectrics, e.g. silicon dioxide and silicon nitride. Thus as device dimensions decrease, there is increasing interest in other dielectrics with higher dielectric constants, e.g. tantalum oxide, and more particularly, ferroelectric dielectrics, which have very high dielectric constants (e>>100).

During the last few years, the use of the ferroelectric materials for random access memory (RAM) elements has reached commercial applications in the semiconductor industry. Ferroelectric dielectrics provide for formation of non volatile memories, with advantages including low voltage programmability, fast access times, and low power consumption.

The ferroelectric dielectric materials which have allowed this breakthrough in integrated circuit applications include perovskite structure ferroelectric dielectric compounds, for example, lead zirconate titanate $PbZr_xTi_{1-x}O_3$ (PZT), barium titanate (BT), and barium strontium titanate (BST).

These ferroelectric materials have large dielectric constants (~500), and thus they are also ideally suited as dielectrics for fabrication of integrated circuit capacitors with small dimensions and large capacitance values, e.g. for use as coupling/de-coupling capacitors and as filter elements.

Nevertheless several challenges and concerns have to be addressed in the integration of ferroelectric materials with monolithic integrated circuits. These challenges include the selection of suitable materials for bottom and top electrodes, and for barrier layers and capping layers, to avoid or control contamination problems. Because ferroelectric materials contain chemical elements not typically found in conventional integrated circuit materials, interdiffusion of elements of the ferroelectric material, heavy metals from the electrode materials, and surrounding materials may occur, causing contamination and degradation of electrical characteristics. This is of particular concern where ferroelectric materials are in close proximity to active devices.

Known methods of forming ferroelectric materials require relatively high temperature heat treatment to form a crystalline ferroelectric phase. The relatively high crystallization temperature limits the application of ferroelectric materials in back-end processing (i.e. during steps such as formation of interconnect and contact metallization) which require a relatively low thermal budget. For example, a layer of a ferroelectric precursor material is deposited in an amorphous form, by a known sol-gel process, followed by annealing, typically above 650° C., to transform the amorphous, as-deposited layer into a crystalline phase, i.e. a perovskite ferroelectric dielectric phase, which has the required ferroelectric dielectric characteristics, characteristic functional properties. Thus, if the interconnect metallization comprises an Al alloy (melting point ~600° C.) or other material which cannot tolerate a large thermal budget (i.e. high temperature and or extended time at elevated temperature), all higher temperature process steps, including deposition and annealing of the ferroelectric layers must be completed before forming the metallization.

For these reasons, ferroelectric capacitors are typically incorporated into the usual process flow after completion of the active devices and before forming the interconnect metallization.

For example, after fabrication of the active devices, a conventional capacitor structure is often formed on a field isolation layer. When ferroelectric capacitors are to be fabricated, a suitable barrier layer is deposited overall to protect underlying structures from diffusion and contamination. A first layer of conductive material is deposited on the surface to form the bottom electrode. For a ferroelectric capacitor, the bottom electrode may be a single layer of conductive material, typically platinum, or preferably a multilayer stack, including an appropriate adhesion layer and/or barrier layer. A layer of ferroelectric dielectric material, e.g. PZT or BST, is deposited over the bottom electrode, and a second conductive layer is then deposited on the dielectric to form the top electrode. Again the top electrode may be a multilayer stack. The layers forming the electrodes and dielectric may be patterned together in a single stack to define the capacitor structure. Alternatively, the layers may be individually deposited and patterned to define sequentially the bottom electrode, the capacitor dielectric and the top electrode. After the ferroelectric capacitor structure is formed, a capping layer is deposited overall to encapsulate the capacitor structure. The capping layer is necessary to form another diffusion barrier, to prevent out-diffusion of the ferroelectric material and heavy metal electrode materials into the surrounding regions. The capping layer also prevents in-diffusion of unwanted species which are used in the latter stages of semiconductor processing, which may be detrimental to the ferroelectric dielectric, e.g. hydrogen. Subsequent processing then proceeds in a conventional manner, to complete the interconnect metallization.

There are several technical difficulties associated with this scheme. For example, the capacitor structure is close to the active devices. Contamination is a critical concern unless the defectivity level in the barrier layer is low enough to prevent diffusion and safeguard the integrity of the active devices. The capping layer must be an insulator, and preferably should provide some protection to the capacitor structure during subsequent processing. Even with a capping layer, the capacitor may be subject to ion bombardment during subsequent processing, e.g. reactive ion etching during formation of the interconnect.

Moreover, the placement of the capacitors underneath interconnect metallization reduces the porosity of the interconnect routing, i.e. the interconnect must be routed around, rather than through, a relatively large area occupied by the capacitors. Thus the interconnect routing efficiency is restricted, which limits the packing density of the underlying devices.

Placing a ferroelectric capacitor below several layers of interconnects and thick dielectrics may cause stress, which may induce stress related fatigue of the ferroelectric material. Moreover, exposure to the diffused hydrogen commonly used in the subsequent metal deposition steps and sintering, i.e. to form interconnect materials, can chemically reduce a PZT film and cause premature fatigue.

Consequently, while ferroelectric capacitors show potential as compact, high capacitance capacitors for integrated circuits, many processing related problems in known structures and process schemes remain to be solved. On the other hand, large value capacitors formed with conventional dielectrics take up unacceptably large areas, which restrict device packing density and interconnect routing efficiency in advanced submicron technologies.

SUMMARY OF THE INVENTION

Thus, the present invention seeks to provide a capacitor structure and a method of forming capacitor for an integrated circuit, and a method of adding on-chip capacitors to an integrated circuit, which avoid or reduce the above mentioned problems.

According to one aspect of the present invention there is provided an integrated circuit and a capacitor formed thereon comprising: a plurality of vias defined through the passivation layer and the top dielectric layer; a first conductive layer defining a first capacitor electrode extending over the surface of the passivation layer and contacting the underlying metallization through one of said vias; a layer of capacitor dielectric formed on the first capacitor electrode; a second conductive layer formed thereon defining a top capacitor electrode, part of the second conductive layer extending laterally of the first electrode over the surface of the passivation layer and contacting the underlying metallization through another of said vias.

Thus, to reduce some of the constraints mentioned above, a capacitor is placed on top of the passivation layer of an otherwise completed integrated circuit (IC), as close to the end of processing as possible. Fabrication of the interconnect metallization for sub-micron integrated circuits typically includes one or more planarization steps to maintain planarity for each interconnect level, and thus provides a top surface having a flat passivation layer. This planar surface of the passivation layer provides an ideal place to build capacitors.

A capacitor comprising a bottom electrode, capacitor dielectric and a top electrode are defined over the passivation layer. Connections are made from the electrodes to the underlying metallization from the underside of the capacitor structure, through conductive vias extending through the dielectric and passivation layers, to the underlying interconnect metallization and/or the appropriate bond pad openings.

Vias are simply opened to connect the capacitor electrodes as required to the underlying interconnect. It is not necessary to re-route interconnect and contacts to the underlying devices. Thus, even very large area capacitors can be provided on top of the integrated circuit without limiting the interconnect routing efficiency of the underlying integrated circuit.

The process technology used for forming the capacitors may be totally independent of that used for the underlying integrated circuit. Capacitors may be formed by any suitable process steps at temperature compatible with preserving the integrity of the underlying integrated circuit. For example, when conventional low melting point alloys, e.g. Al alloys, are used for the underlying metallization, a capacitor may be provided by using the same metallization schemes to form the top and bottom capacitor electrodes and a capacitor dielectric, e.g. silicon dioxide, formed by a known low temperature deposition method.

On the other hand when high temperature metallization schemes, e.g. tungsten or copper, are used in the underlying integrated circuit, appropriate alternative conductive and dielectric layers may be used to form the capacitor structures.

Advantageously, the capacitor dielectric comprises a dielectric having a high dielectric constant, particularly a ferroelectric dielectric.

Each of the layers forming the top and bottom electrodes and dielectric may be patterned conventionally, e.g. by dry etching.

Alternatively, the structure may comprise a first (bottom) electrode which is patterned conventionally by photolithography and etching. An overlying layer of capacitor dielectric is deposited to cover the bottom electrode and extend around the sides of the bottom electrode. Then, an overlying conductive layer is deposited thereon to form a top electrode. The top electrode itself encapsulates the underlying dielectric and bottom electrode. The resulting capacitor has a capacitance defined by the area of bottom electrode, and the capacitance is substantially independent of the size of the top electrode. The top electrode encapsulates and protects the dielectric material. This structure is particularly useful when the dielectric is a ferroelectric dielectric, so that an additional barrier layer or capping layer may not be required.

If required, a coating of polyimide, or other suitable protective material may be applied in a conventional manner after completing the capacitor, e.g. to provide scratch protection.

The capacitor structure is particularly beneficial in reducing device contamination concerns by physically separating ferroelectric capacitors from the active devices. The separation distance is larger than in conventional ferroelectric capacitors fabricated underneath the interconnect metallization. Moreover, a conventional passivation layer, e.g. silicon nitride, forms a barrier layer against diffusion of elements from the ferroelectric material. Processing of the ferroelectric material is done after completion of the underlying IC, which avoids or reduces process induced degradation the ferroelectric material.

Preferably, the ferroelectric dielectric is deposited by a low temperature process, which allows for a ferroelectric capacitor to be provided on an integrated circuit comprising conventional known aluminum alloy metallization. In this respect, a low temperature process for formation of the ferroelectric dielectric e.g. below 500° C. is described in copending U.S. patent application Ser. No. 08/348,848 to Emesh et al., filed concurrently herewith, to the same assignee, which provides a method which would be compatible with interconnect metallization in an underlying integrated circuit formed from low melting point metal alloys, e.g. aluminum alloy.

Alternatively, other known methods of forming ferroelectric dielectrics may be used if processing is compatible with the materials of the underlying integrated circuit, particularly if higher process temperatures are not a limitation.

Conveniently, the capacitor structure comprises electrodes having a conventional rectangular form, with vias contacting the underside of the bottom electrode and the top electrode having a tab extending laterally to make contact to the underlying metallization through a via adjacent the bottom electrode.

According to another aspect of the present invention, there is provided a method of forming a capacitor for an integrated circuit the integrated circuit having interconnect metallization and an overlying passivation layer comprising a substantially planar surface; the method comprising: opening vias through the passivation layer for contacting the underlying interconnect metallization; filling selected vias with conductive material; selectively depositing a first layer of conductive material on the surface of the passivation layer to define a bottom electrode connected to the underlying interconnect metallization through one of the selected vias; providing a capacitor dielectric on the bottom electrode, and forming on the capacitor dielectric a second conductive layer defining a top capacitor electrode, the top capacitor electrode extending laterally of the bottom electrode and being connected with the underlying interconnect metallization through another of the selected vias.

Thus the method is applicable to forming a capacitor structure on the surface of the passivation layer of an otherwise completed integrated circuit.

Advantageously, after providing the bottom electrode, e.g. by depositing the first conductive layer and patterning, by photolithography and etching by a known method e.g. dry etching, to define the bottom electrode of the capacitor, a layer of the capacitor dielectric is deposited thereon, so as to cover and enclose the sides of the bottom electrode, and the top electrode is deposited to encapsulate the capacitor dielectric. Thus, layers forming the dielectric and the top electrode may be patterned conventionally by dry etching. However, in this structure, the capacitance is determined primarily by the dimension of the bottom electrode, and is virtually independent of the dimension of the top electrode. Thus patterning of the dielectric and top electrode may not require as high resolution patterning as the bottom electrode. Fabrication may be simplified significantly by patterning layers of dielectric and the top electrode using a wet etch process, or by deposition through a stencil mask.

Beneficially, the capacitor dielectric is provided by a ferroelectric dielectric, or other dielectric having a high dielectric constant. Thus a higher value capacitor of reduced area may be provided on the integrated circuit.

The structure is readily fabricated. Processing is completely decoupled from that of the underlying integrated circuit (IC). The nitride passivation layer typically used to complete IC fabrication forms an effective barrier layer for ferroelectric materials and heavy metal electrodes typically used with ferroelectric dielectrics. Additional barriers layers and capping layers may not be required. Indeed, isolation of the ferroelectric capacitors from active devices is improved compared with conventional known structures.

According to a further aspect of the invention there is provided a method of adding an on-chip capacitor to an integrated circuit chip comprising a substrate having active devices formed thereon, interconnect metallization and an overlying passivation layer having a planar surface, the method comprising forming capacitors on top of the passivation layer comprising: defining vias through the passivation layer for contacting the interconnect metallization; filling the vias with conductive material and forming a capacitor on the surface of the passivation layer by deposition of a bottom electrode, a capacitor dielectric, and a top electrode, electrical connections being provided from the top and bottom electrodes of the capacitors through selected vias to the underlying IC interconnect metallization.

According to yet another aspect of the present invention there is provided a method of adding capacitors to an integrated circuit chip comprising a substrate having active devices formed thereon, interconnect metallization and an overlying passivation layer having a planar surface with bond pad openings to the underlying metallization; the method comprising: forming capacitors on top of the passivation layer by steps comprising: defining contact openings to the interconnect metallization by opening vias through the passivation layer; forming a capacitor on the surface of the passivation layer by deposition of a layer of conductive material to form a bottom electrode, a layer of a capacitor dielectric, and a second layer of conductive material defining a top electrode, selectively filling the vias with conductive material to provide electrical connections to the underlying IC interconnect metallization, said connections being provided from the top electrode and the bottom electrode of the capacitors respectively through selected vias filled with conductive material.

Thus one or more relatively large on-chip capacitors may be formed on top of the passivation of an otherwise completed IC without reducing the routing efficiency of the interconnect metallization of the underlying IC. By avoiding routing of conductors around the capacitors, a large reduction in chip area can be achieved relative to a scheme in which large area capacitors are incorporated under or between the metallization layers.

The capability of adding capacitors to a completed integrated circuit has far reaching consequences. Since many systems, e.g. mobile communications equipment, may typically require off-chip circuitry having a large number (tens) of capacitors, the capability of incorporating at least some of these capacitors on-chip is very attractive, resulting in a large reduction in system size. Further, the capacitors are directly connected to the IC to provide improved performance. The structure is particular advantageous in overcoming some of the processing difficulties associated with ferroelectric dielectric materials, and thus provides an improved structure for fabrication of high value capacitors using ferroelectric dielectrics.

Thus the present invention provides a capacitor structure for an integrated circuit, a method of forming an integrated circuit capacitor, and a method of adding on chip capacitors to an integrated circuit, which overcome or reduce many of the above mentioned problems.

BRIEF DESCRIPTION OF THE DRAWINGS

Embodiments of the invention will now be described by way of example, with reference to the accompanying drawing, in which.

DESCRIPTION OF THE PREFERRED EMBODIMENTS

Figure 1:
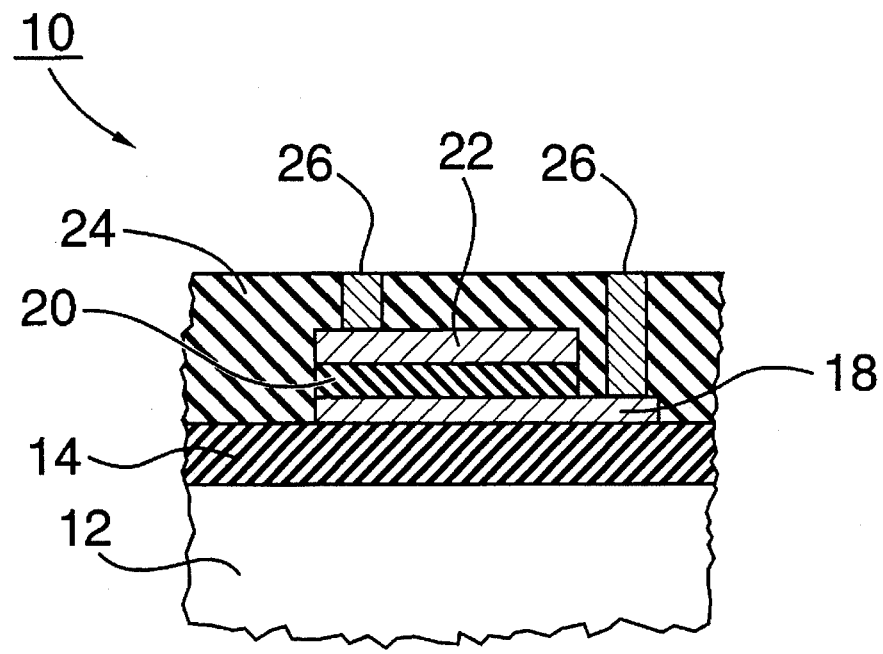
FIG. 1 shows a conventional prior art capacitor structure for an integrated circuit.

Part of an integrated circuit comprising a known conventional prior art capacitor structure 10 is shown in FIG. 1. The capacitor 10 is formed on a conventional semiconductor substrate 12, e.g. a silicon wafer, having a field isolation layer 14, e.g. a layer of silicon dioxide formed thereon. The substrate comprises active device structures (not shown) fabricated by a known method. The latter device structures may comprise, e.g. bipolar and CMOS transistors, diodes, memory cells, etc. as is conventional in an integrated circuit. A first layer of conductive material is deposited on the field oxide and patterned to define a bottom electrode 18 of the capacitor. A layer of capacitor dielectric 20 is formed on the bottom electrode and an overlying layer of conductive material is deposited and patterned to define a top electrode 22. A dielectric layer 24 isolates the capacitor electrodes from surrounding structures. One or more layer of interconnect metallization are then provided in a conventional manner, with contacts to the capacitor electrodes from the overlying interconnect being provided through conductive vias 26.

Figure 2:
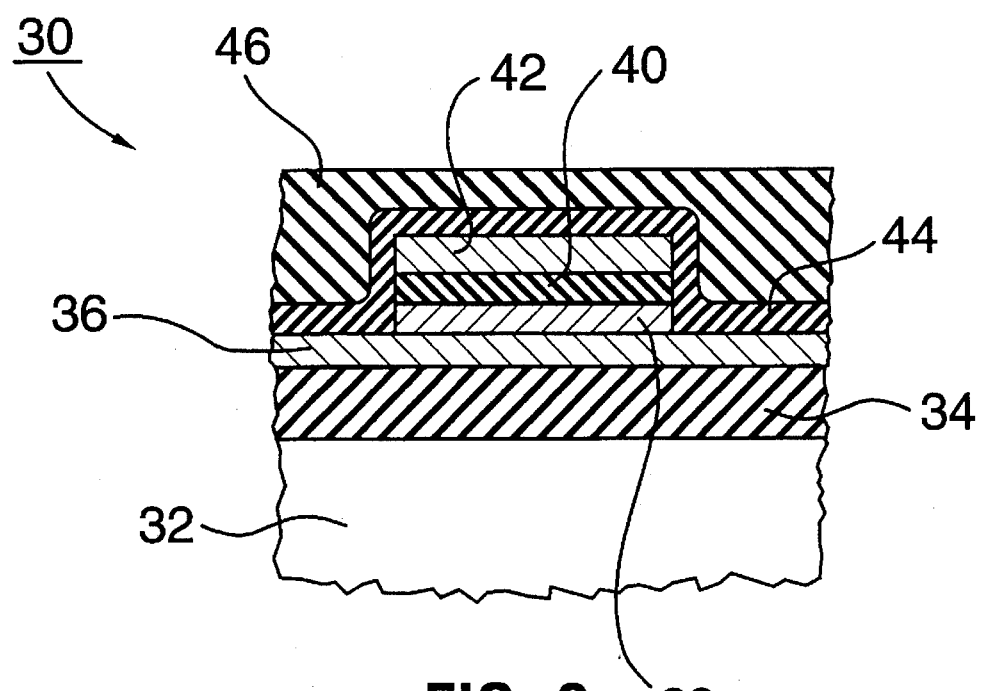
FIG. 2 shows a known structure for a capacitor structure for an integrated circuit, adapted for use with a ferroelectric capacitor dielectric.

Part of an integrated circuit including a conventional capacitor structure similar to that in FIG. 1, adapted for use with a ferroelectric capacitor dielectric, is shown in FIG. 2. The capacitor 30 is provided on a semiconductor substrate 32 similar to that described above, having a field isolation layer 34 formed on the surface. The structure differs from that in FIG. 1 in that a barrier layer 36 is then deposited overall. A conductive layer is then deposited and patterned to define a bottom electrode 38 of the capacitor. A layer of capacitor dielectric 40, i.e. a ferroelectric material with a high dielectric constant is then deposited on the bottom electrode 38. Another conductive layer is then deposited and patterned to form the top electrode 42 of the capacitor. After the capacitor stack has been patterned to define capacitor structure, it is encapsulated with a capping layer 44, which provides another diffusion barrier. An overlying dielectric layer 32 is deposited thereon and planarized. Contacts to top and bottom electrodes (not shown) are then opened and interconnect metallization is completed in a conventional manner.

As mentioned above several technical difficulties arise from this scheme. The use of a ferroelectric dielectric necessitates use of barrier and capping layers to reduce diffusion and contamination from elements of the ferroelectric dielectric material. Also, interconnect metallization for forming contacts to underlying active devices must be routed around the relatively large area occupied by the capacitor electrodes, which reduces device packing density.

Figure 3:
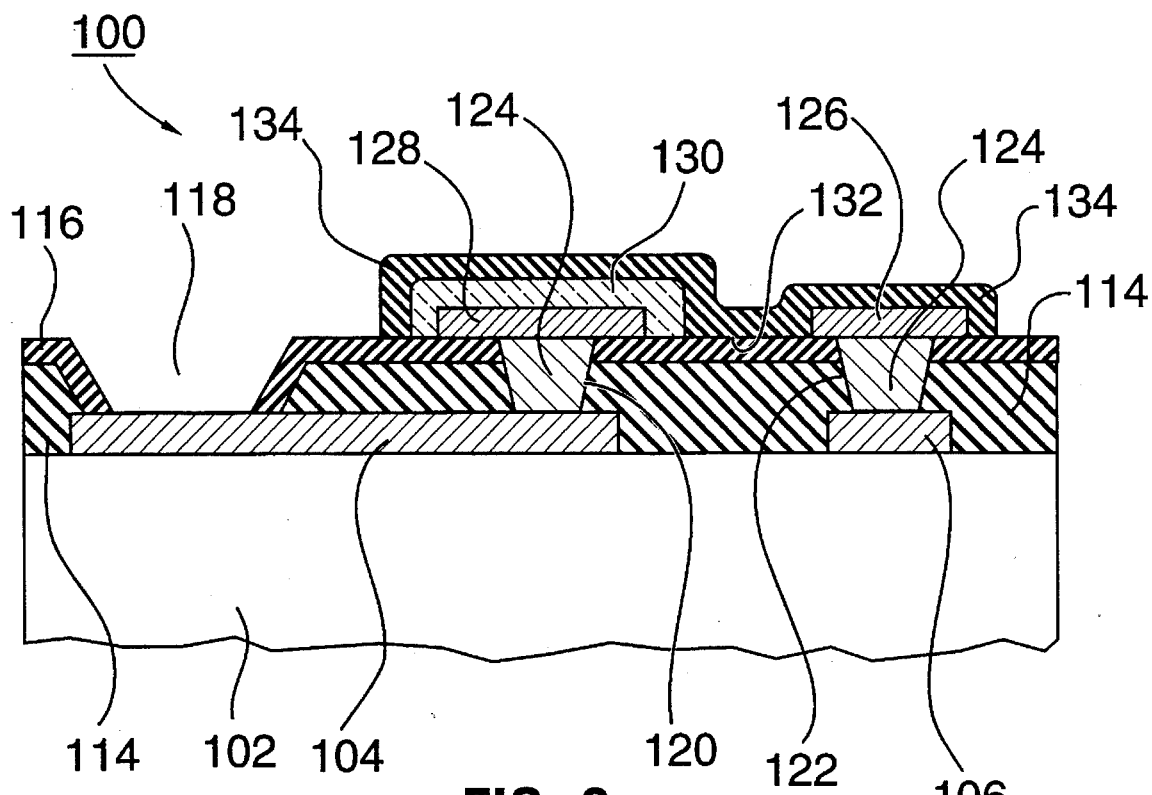
FIG. 3 shows a cross-sectional view through part of an integrated circuit comprising a capacitor according to a first embodiment of the present invention.

Part of an integrated circuit comprising a capacitor structure 100 according to a first embodiment of the present invention is shown in FIG. 3. The substrate 102 comprises a conventionally finished wafer comprising a plurality of completed and passivated integrated circuits. Thus the substrate comprises active devices (not shown) of an integrated circuit, with one or more levels of interconnect metallization and intermetal dielectric. The metallization includes, a top metal layer forming interconnect structures 104 and 106 as shown in FIG. 3. The integrated circuit includes a top dielectric layer 114 to isolate the top metallization. The structure is planarized to form a smooth surface and one of a plurality of bond pad openings 118 is shown. The bond pad opening extends through the dielectric 114 for making external contact to the underlying interconnect metallization 104. A passivation layer 116 is deposited on the surface of the dielectric layer 114 and extends into the bond pad openings 118.

The capacitor 100 is defined on the planarized surface of the passivation layer 116, on the conventionally completed integrated circuit. Contact via openings 120 and 122 are defined through the dielectric and passivation layers 114 and 116. The vias 120 and 122 are filled with conductive material 124. A layer of conductive material 126/128 extends over the surface contacting the conductive material 124 in vias 120 and 122, and is patterned to define a first (bottom) electrode 128 of the capacitor, and a contact 126 to via 122. The bottom electrode 128 of the capacitor is patterned conventionally, e.g. by dry etching, to define an electrode of suitable shape and dimensions. A layer of capacitor dielectric 130, which may be a conventional dielectric or a ferroelectric dielectric material, is selectively deposited on the bottom electrode 128, so as to extend over the surface, and around the edges of the bottom electrode 128, thus surrounding and isolating the bottom electrode 128. A second conductive layer 134 is then deposited over the dielectric 130 and is patterned to define a second (top) electrode 134. The second conductive layer 134 extends laterally over the surface 132 of the passivation layer adjacent the electrode 128 and dielectric 130, and contacts the conductive layer 126 to allow for interconnection of the top electrode, through via 122 to the underlying interconnect metallization 106.

Thus the capacitor 100 is formed on top of a the passivation layer and the capacitor has a form which is inverted relative to a conventional capacitor structure, in that interconnections to the electrodes are made from the underside of the capacitor, by conductive vias through the passivation layer to the underlying interconnect metallization. In this way, on-chip capacitors may be added to integrated circuit without disrupting routing of the underlying interconnect. Minor redesign only is required to route interconnect to allow for formation of contact vias from the electrodes to the underlying metallization.

Any suitable materials and process steps compatible with the underlying substrate materials may be used to form the capacitor structure. In a conventional integrated circuit, for example, the interconnect metallization comprises an aluminum alloy with an anti-reflection coating, e.g. titanium nitride TiN, the intermetal dielectric comprises silicon dioxide, or BPSG, and the passivation layer comprises silicon nitride. Capacitors may be formed on the surface of the barrier layer using the same metallization scheme, and using a conventional capacitor dielectric, e.g. silicon dioxide or silicon nitride.

The structure shown in FIG. 3 is particularly suitable for use with a ferroelectric dielectric. A conventional passivation layer comprising silicon nitride forms a suitable barrier layer for a ferroelectric material such as PZT or BST. Electrodes 128 and 134 comprise platinum or other compatible metallization scheme.

Figure 5:
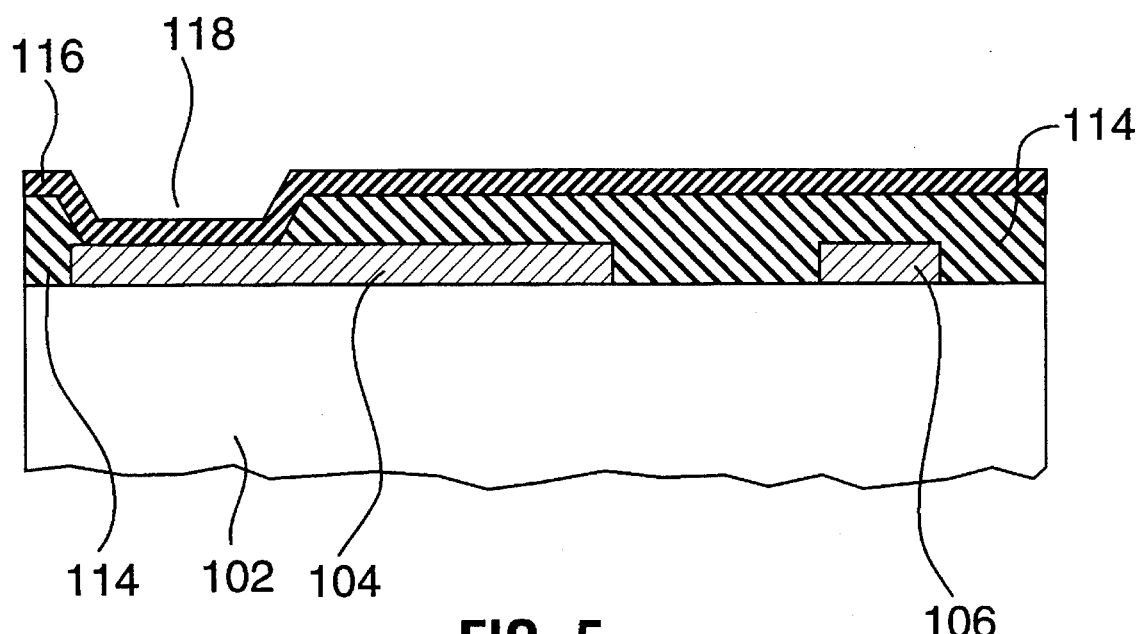
FIGS. 5 to 10 show cross-sectional views through part of an integrated circuit comprising the capacitor structure of the first embodiment at successive stages during fabrication.

Cross-sectional views through the integrated circuit at successive stages during fabrication of the capacitor structure are shown in FIGS. 5 to 10. A conventionally finished integrated circuit substrate 102 is shown in part in FIG. 5, and comprises active devices, conductive contacts and one or more levels of interconnect metallization formed in a conventional manner (not shown). Interconnect structures 104 and 106 which comprises part of a layer of conductive material defining the top metal interconnect are shown in FIG. 5. An overlying dielectric layer 114, e.g. silicon dioxide isolates the interconnect metallization and is planarized to provide a substantially planar surface. A bond pad opening 118 is defined through the dielectric layer 114 for forming external contacts to the underlying interconnect metallization 104. A passivation layer 116, e.g. silicon nitride, is provided on the dielectric layer 114 and extends into the bond pad opening 118 to protect the bond pad metallization during the following processing steps.

Figure 6:
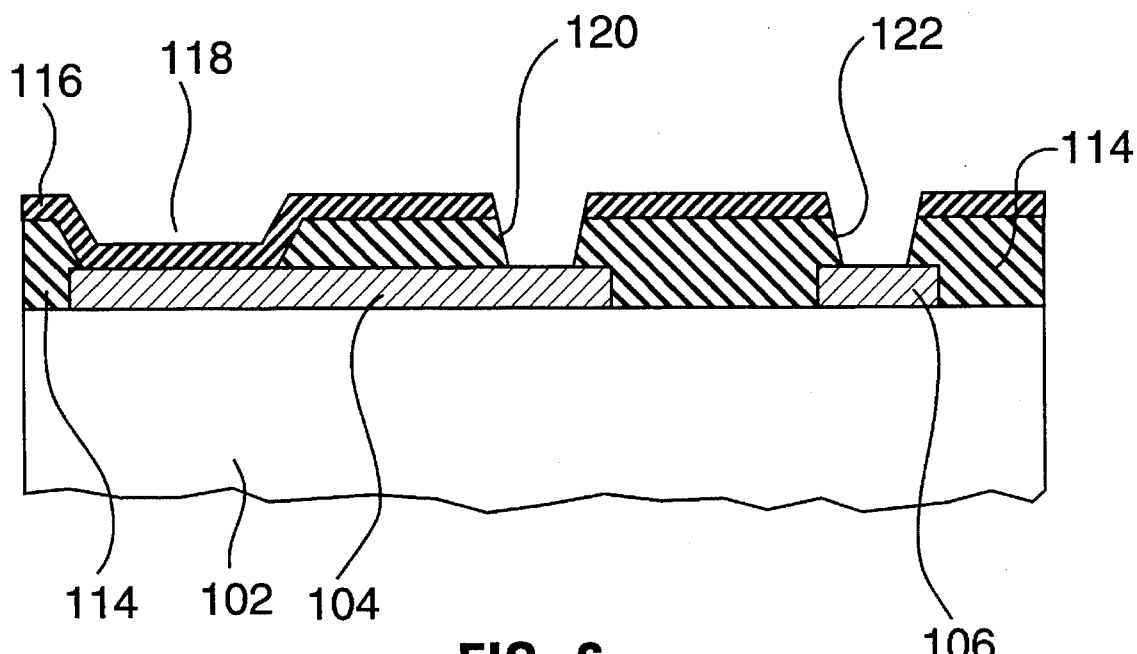
Figure 7:
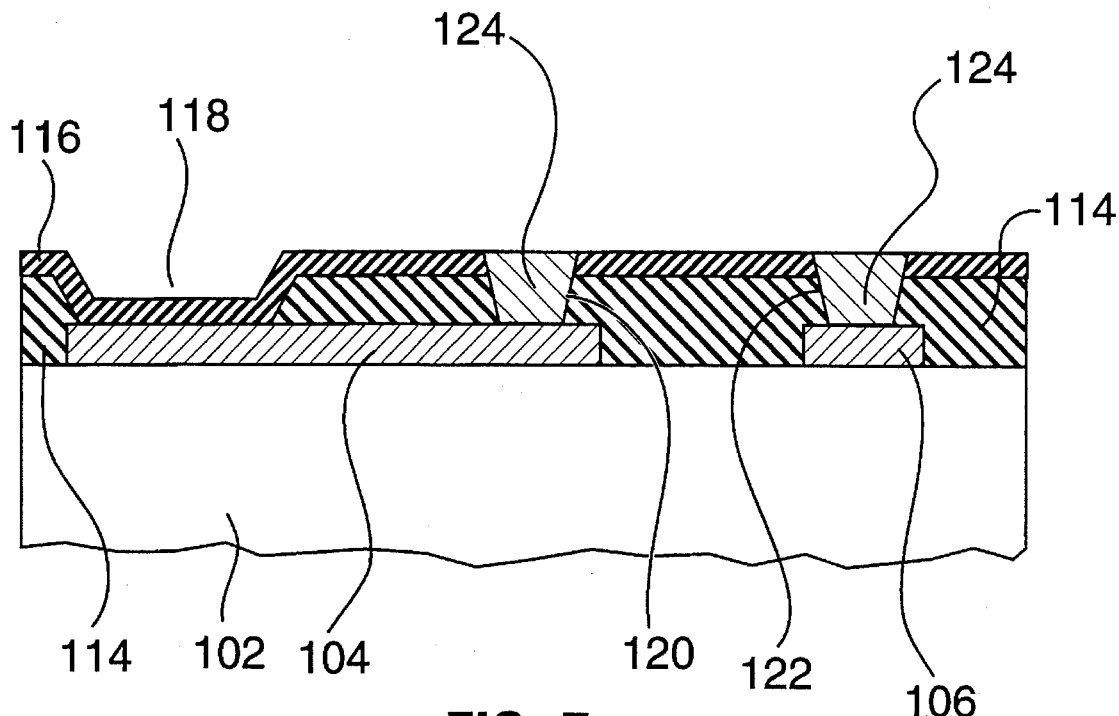
Figure 8:
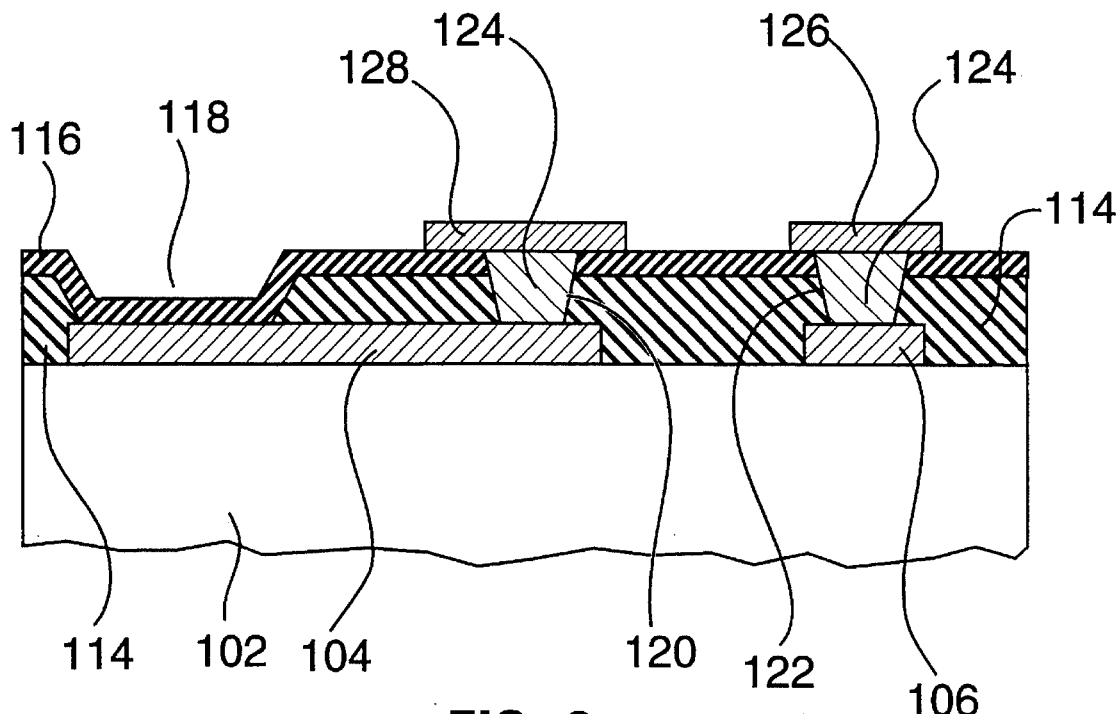
Figure 9:
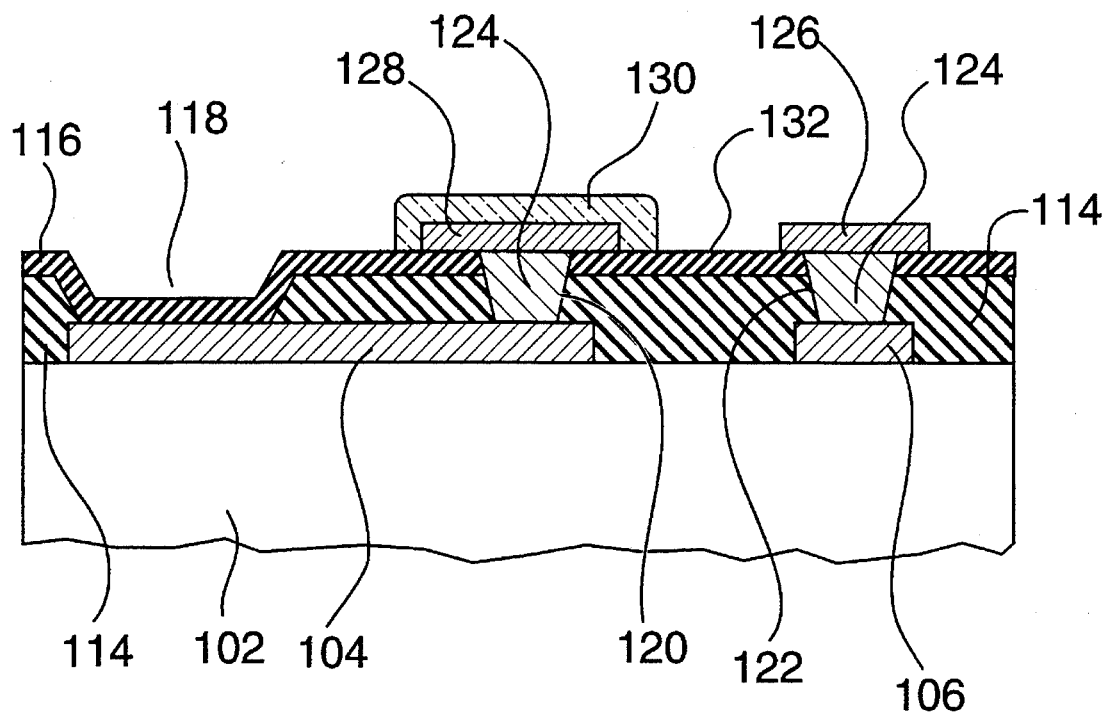
Figure 10:
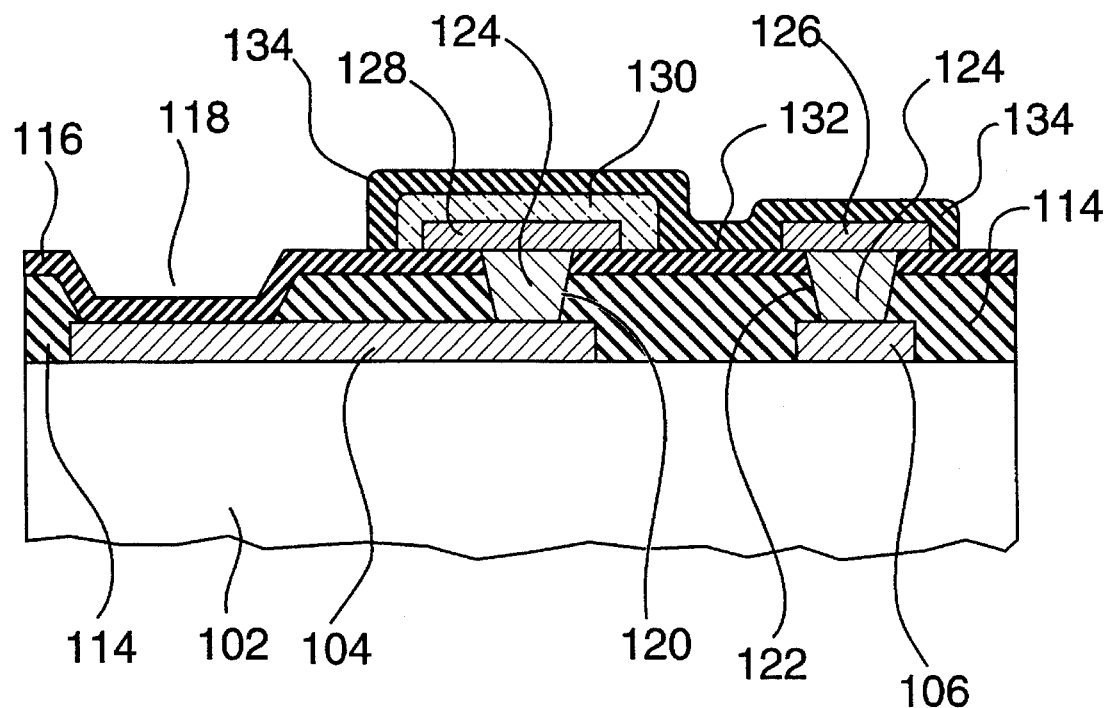

To add on-chip capacitors to the otherwise finished integrated circuit, as shown in FIG. 5, after suitably protecting or masking the bond pad openings, vias 120 and 122 are opened selectively through the passivation layer 116 and the dielectric layer 114, as shown in FIG. 6, using any suitable known method. The vias 120 and 122 are filled with a first layer of conductive material 124 (FIG. 7). A second layer of conductive material is then provided on the surface of the passivation layer 118, contacting the conductive material 124 in the vias 120 and 124. The second layer of conductive material is patterned to define a bottom electrode 128 and a conductive contact area 126 (FIG. 8) on the surface 132 adjacent the bottom electrode. A layer of capacitor dielectric 130 is then deposited selectively on the electrode 128, so as to extend around the sides of the bottom electrode to surround the bottom electrode 128 as shown in FIG. 9. Preferably the dielectric 130 comprises a material having a high dielectric constant, and in particular a ferroelectric dielectric, e.g. PZT. A second conductive layer 134 is then deposited to define a top electrode which extends laterally over the dielectric 130 to enclose the dielectric. The second conductive layer also extends over the surface 132 of the passivation layer and contacts first conductive layer 126 to form a contact to the underlying metallization 106 through via 122 (FIG. 10). Thus the capacitor comprises first electrode 128, capacitor dielectric 130 and top electrode 134. Connections from the electrodes to the metallization 104, 106 of the underlying integrated circuit are made through conductive vias 120, 122 extending underneath the capacitor structure 100. After the capacitor structure is completed, as shown in FIG. 10, a capping layer may be provided overall if required. The latter may be provided as a scratch protection layer, e.g. a layer of polyimide or other suitable protective layer.

The bottom electrode 128 is patterned by photolithography and etched to define accurately the bottom electrode dimensions. Since the dielectric 130 and top electrode 134 enclose and encapsulate the bottom electrode, the capacitance is defined by the dimensions of the bottom electrode. The capacitance is thus substantially independent of the dimensions of the dielectric 128 and top electrode 130. If required, the top electrode and dielectric layers may be selectively deposited, e.g. through a stencil mask, or patterned by another method, e.g. wet etching, which has a lower resolution. Contact openings to for external contacts to the bond pad metallization are then formed to complete the structure as shown in FIG. 3.

The description of the process for forming a capacitor for integrated circuit according to first embodiment is based on silicon technology. The process of the embodiment may be used to add capacitors to a wafer prepared by any conventional process technology including bipolar, CMOS and BiCMOS processes. Alternatively, since the process for forming the capacitor is decoupled from that of forming the underlying IC, the process is also applicable for adding capacitors to ICs formed using semiconductors other than silicon, e.g. for compound semiconductors, including GaAs process technologies for high speed ICs. There is a great deal of flexibility in implementing the structure in different materials providing the process is compatible with the underlying integrated circuit.

Figure 4:
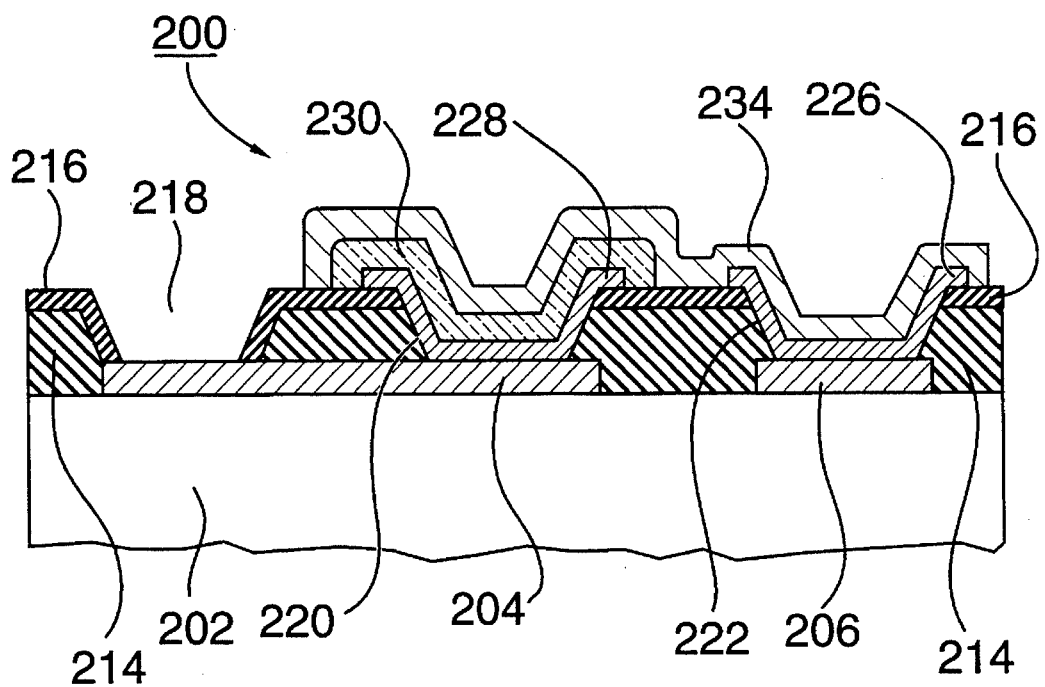
FIG. 4 shows a cross-sectional view through part of an integrated circuit comprising a capacitor structure according to a second embodiment of the present invention.

In a capacitor structure 200 according to a second embodiment of the present invention, as shown in FIG. 4, the capacitor structure is similar to that of the first embodiment in being formed on top of the passivation layer 216 of an integrated circuit, on the surface of an underlying integrated circuit substrate 202. The capacitor 200 comprises a bottom electrode 228, a capacitor dielectric 230 and top electrode 234. The structure differs from that of the first embodiment in that the vias 220 and 222 defined through the passivation layer 216 and dielectric layer 214 are relatively large, e.g. they may be comparable in size to a bond pad opening. A first conductive layer is deposited conformally over the surface and extends into the vias 220 and 222. The first conductive layer is patterned to define conductive electrode 226 in via 222 and bottom capacitor electrode 228 in via 220. A layer 230 of capacitor dielectric is then deposited directly on bottom electrode 228 and extends over its edges to encapsulate the bottom electrode. A second conductive layer 234 is then deposited overall and patterned to form a top electrode. The top electrode surrounds the dielectric 230 and extends laterally over the surface 232 of the passivation 214 and contacts electrode 226 of the first conductive layer in via 222. Thus the capacitor structure is defined with only the conductive layers defining the electrodes, and an intervening capacitor dielectric layer.

Figure 11:
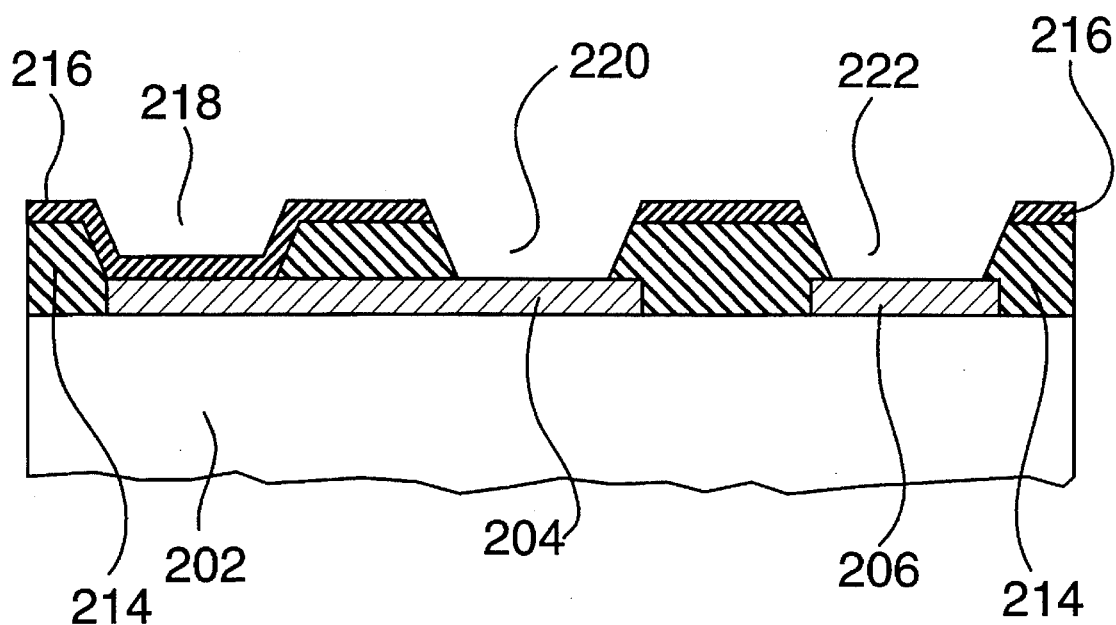
FIGS. 11 to 14 show cross-sectional views through part of an integrated circuit comprising the capacitor structure of the second embodiment at successive stages during fabrication.
Figure 12:
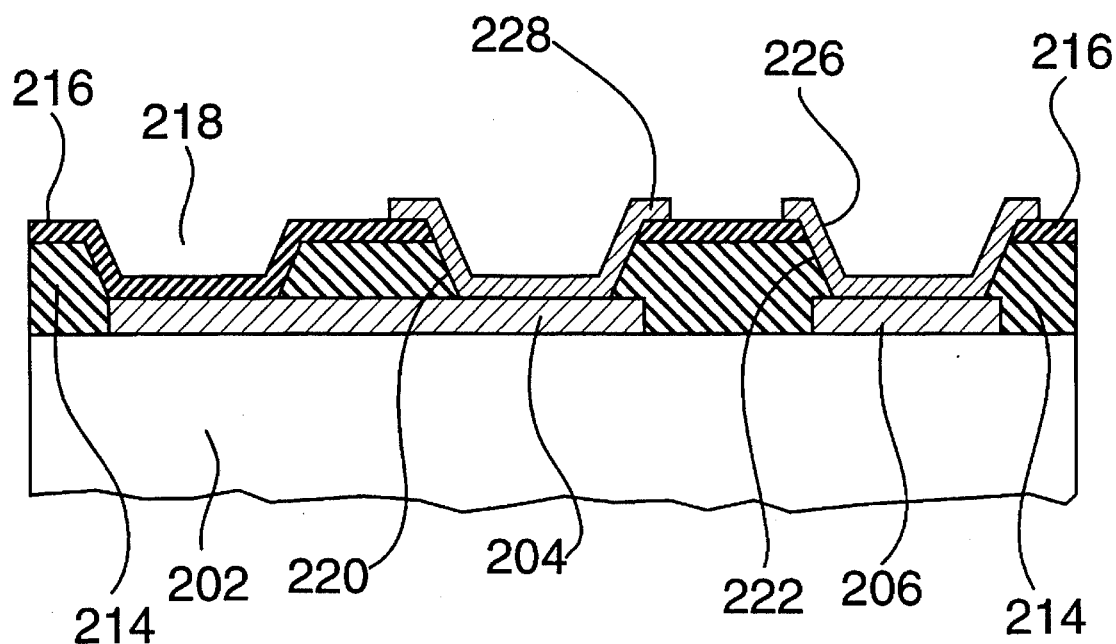
Figure 13:
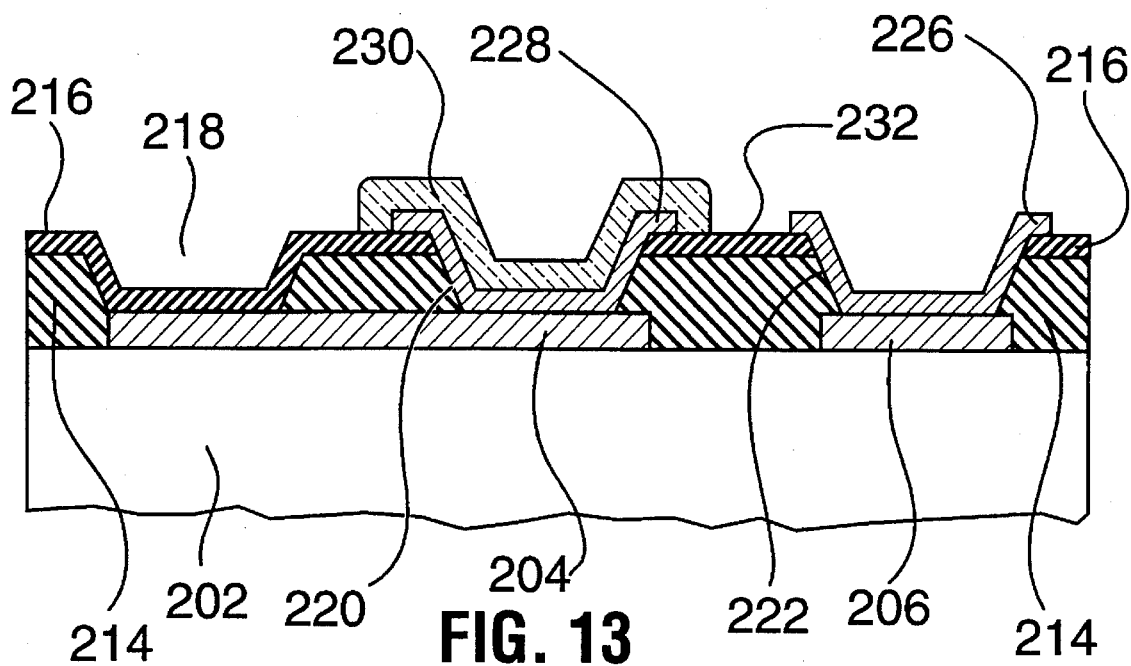
Figure 14:
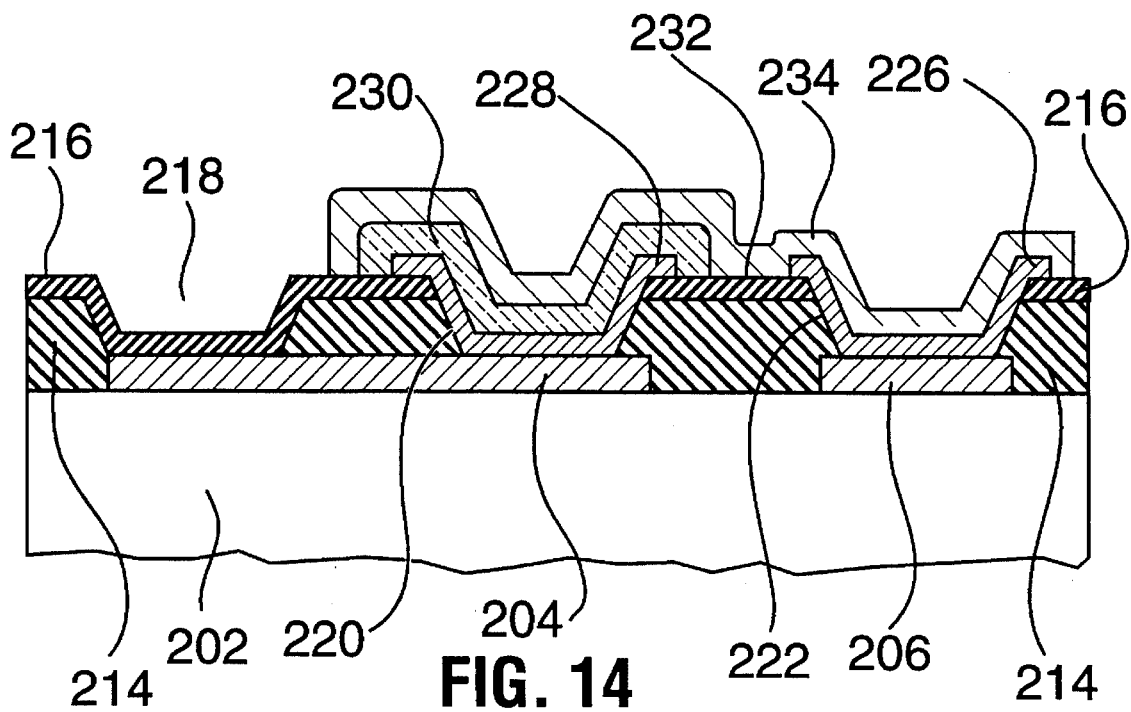

In a method of forming a capacitor structure according to the second embodiment, as shown in FIGS. 11 to 14, an integrated circuit 202 substrate is provided, similar to that described for the structure of first embodiment, comprising active devices, interconnect metallization, a top dielectric 214. Bond pad openings 218 are defined through the dielectric, and a surface passivation layer 216 extends overall. Vias 220 and 222 are then selectively opened through the passivation 216 and dielectric layer 214 on the surface, to expose parts of the top metallization layer 204 and 206 (FIG. 11). A first conductive layer is then deposited overall and patterned to define conductive electrode 226 in via 222 and bottom capacitor electrode 228 in via 220 (FIG. 12). A layer of capacitor dielectric 230 is then selectively deposited over the bottom electrode 228 (FIG. 13). A second conductive layer 234 is then deposited overall and patterned to define the top capacitor electrode 234 which extends laterally over the surface to contact the electrode 226 of the first conductive layer (FIG. 14). The capacitor structure is then completed as shown in FIG. 4, if required providing a capping layer or a protective layer overall (not shown). Contacts are then opened through the passivation layer to the bond pads 218.

It will be appreciated that many variations of these embodiments may be provided. For example, in a variation of the first embodiment, a single conductive layer may be provided to fill the vias 120 and 122 and to provide the bottom electrode 128.

Furthermore, capacitor structures need not be limited to simple two electrode structures. For example two or more capacitor structures may be coupled together through parts of the top interconnect metallization of the underlying integrated circuit, or alternatively by interconnect conductors defined by parts of the conductive layers forming the top electrodes.

Capacitor structures according to the embodiments may also be adapted to form multilayer, stacked capacitors, by depositing additional layers of metallization and intermetal/ capacitor dielectrics, e.g. to form capacitors comprising two stacked pairs of electrodes connected in a parallel.

Clearly, methods of forming the electrode structure of the capacitor may include depositing overall the a first conductive layer to form the bottom electrode, depositing thereon a layer of capacitor dielectric and a second conductive layer, and then subsequently patterning each layer of the stack, either individually or simultaneously, to define the capacitor structure. Alternatively, each electrode and the dielectric may patterned individually, e.g. by photolithography and selective etching, or by selective deposition through a masking layer.

However, in the methods described above for the capacitor structures of the first and second embodiments, in which the top electrode and dielectric encapsulate the bottom electrode, only one high resolution patterning step is required to define the bottom electrode, e.g. by photolithography and dry etching. A lower resolution method, e.g. selective deposition using a stencil mask may be used for defining the dielectric and top electrode, particularly for large area capacitors. Providing the bond pad metallization is suitably protected during processing, a wet etch may alternatively be considered for patterning the dielectric and top electrode layers.

Conventional dielectrics such as silicon oxide, silicon nitride and silicon oxynitride can typically achieve, at best, capacitances of 2 to 3 fF/$\mu m^2$. While capacitors fabricated according to the present invention can be formed with conventional dielectrics, the capacitors according to the invention are advantageous particularly when their application is for large value capacitors which cannot be readily incorporated during conventional processing without a large area penalty in re-routing interconnect around the capacitor. A number of applications require capacitors in the nF range, e.g. for coupling/decoupling capacitors, filters, etc. Thus it is advantageous to use dielectrics with high dielectric constants. Ferroelectric materials are particularly suited for these higher value capacitors. These materials typically have high dielectric constants ~500, which make them attractive for use in high capacitance capacitors. For example, lead zirconate titanate has a dielectric constant of 1000 in bulk form, and typically >300 in thin films deposited as described above. In the present work, using thin films of PZT as a capacitor dielectric, capacity greater than 30 fF/$\mu m^2$ was achieved. BST is another ferroelectric material in which there is much interest, particularly for high frequency integrated circuit application.

Capacitors may be interconnected individually to an integrated circuit, or alternatively the capacitors may be coupled together, e.g. interconnected through the top interconnect metallization. Thus a plurality of high value capacitors can be added to an otherwise completed integrated circuit, eliminating the need for some, or all, off-chip capacitors for many applications.

Furthermore, the capacitor structure may be used fabricated from many other different materials compatible with IC fabrication. Suitable conductive materials for formation of the capacitor electrodes include known metallization schemes, e.g. aluminum alloys, and alternative metallization schemes including copper, tungsten, etc., as well as noble metals.

As mentioned above, Pt is typically used as the metal electrode of choice for ferroelectric capacitor electrodes, in conjunction with suitable barrier layers and adhesion layers comprising, e.g. Ti or other refractory metals. However, the capacitor structure is isolated by the passivation layer from the underlying integrated circuit, thus easing concerns regarding diffusion and contamination. Alternative or conventional metallization schemes may be considered for use also with as ferroelectric dielectrics, particularly if a ferroelectric dielectric is deposited at low temperature. Higher temperature deposition processes for ferroelectric dielectric materials may be used with alternative metallization schemes, e.g. tungsten, copper, other noble metals which are more temperature resistant. Thus, there is a great deal of flexibility provided in implementing this capacitor structure. The major constraint is that processing conditions, particular process temperatures are compatible with preserving the integrity of the underlying integrated circuit. While patterning of the capacitor structure may be done by reactive ion etching or ion milling, capacitors of relatively large dimensions may be patterned by stencil masks or wet etching, which may be beneficial if avoiding ion damage and radiation damage to the dielectric material, as well as the underlying integrated circuit must be avoided.

Thus, although specific embodiments are described above in detail, it will be appreciated that numerous variations and modifications to the embodiments may be made within the scope of the invention defined in the following claims.

What is claimed is:

1. A capacitor structure for an integrated circuit, the integrated circuit comprising active devices formed on a semiconductor substrate, overlying layers comprising interconnect metallization, a top dielectric layer having bond pad openings formed through the dielectric for contacting the underlying interconnect metallization, and a surface passivation layer formed over the integrated circuit, the capacitor structure formed on a surface of the passivation layer, comprising:

a plurality of vias defined through the passivation layer and the top dielectric layer;

a first conductive layer defining a first capacitor electrode extending over the surface of the passivation layer and contacting the underlying interconnect metallization through at least one of the plurality of vias;

a layer of capacitor dielectric formed on the first capacitor electrode;

a second conductive layer formed on the capacitor dielectric and overlying the first electrode and defining a top capacitor electrode, part of the second conductive layer extending laterally of the first electrode over the surface of the passivation layer and contacting the underlying interconnect metallization through another of the plurality of vias;

thereby routing interconnections from each of the electrodes of the capacitor to the interconnect metallization of the underlying integrated circuit through the passivation layer underneath the conductive layers forming the capacitor structure.

2. A capacitor structure according to claim 1 wherein the first electrode comprises a conductive layer having a top surface and sidewalls, the layer of capacitor dielectric covers the surface and sidewalls of the first electrode, and the top electrode extends over the dielectric layer, thereby enclosing the capacitor dielectric.

3. A capacitor structure according to claim 1 wherein the capacitor dielectric comprises a ferroelectric dielectric material.

4. A structure according to claim 3 wherein the ferroelectric dielectric is selected from the group consisting of lead zirconate titanate and doped lead zirconate titanate.

5. A structure according to claim 3 wherein the ferroelectric dielectric comprises barium strontium titanate.

6. A capacitor structure according to claim 1 wherein the underlying metallization comprises an aluminum alloy.

7. A capacitor structure according to claim 1 comprising a protective layer deposited over the capacitor structure.

8. A capacitor according to claim 7 wherein the protective layer comprises a layer of dielectric material.

9. A structure according to claim 1 wherein the capacitor dielectric comprises a ferroelectric dielectric and the bottom electrode comprises a multilayer stack comprising a conductive metal layer, and an adhesion layer.

10. A structure according to claim 1 wherein the passivation layer comprises silicon nitride.

11. A capacitor structure for an integrated circuit, the integrated circuit comprising active devices formed on a semiconductor substrate, overlying layers comprising interconnect metallization, a top dielectric layer having bond pad openings formed through the dielectric layer for contacting the underlying interconnect metallization, and a passivation layer formed over the integrated circuit, the capacitor structure being formed on a surface of the passivation layer, comprising:

a plurality of vias defined through the passivation layer and the top dielectric layer for contacting the interconnect metallization of the underlying integrated circuit, the vias being filled with conductive material coplanar with the surface of the passivation layer, a first conductive layer formed on the passivation layer and defining a first conductive electrode forming a contact with the underlying interconnect metallization through one of the filled vias, a layer of capacitor dielectric formed on the first conductive electrode, a second layer of conductive material formed on the capacitor dielectric and defining a top electrode of the capacitor overlying the first electrode and extending laterally of the first electrode and forming a contact with the underlying interconnect metallization through another of said filled vias.

12. A capacitor structure for an integrated circuit, the integrated circuit comprising active devices formed on a semiconductor substrate, overlying layers comprising interconnect metallization, a top dielectric layer having bond pad openings formed through the dielectric for contacting the underlying interconnect metallization, and a surface passivation layer formed over the integrated circuit, the capacitor structure formed on a surface of the passivation layer, comprising:

a plurality of vias defined through the passivation layer and the top dielectric layer for contacting the underlying metallization of the integrated circuit;

a first conductive layer extending over the surface of the passivation layer and defining a first capacitor electrode and a first contact electrode, the first capacitor electrode extending over a via of the plurality of vias and forming a contact with the underlying interconnect metallization of the integrated circuit, and the contact electrode extending over another via of the plurality of vias and forming a contact with the underlying interconnect metallization of the integrated circuit;

a layer of capacitor dielectric formed on the first capacitor electrode;

a second conductive layer formed on the capacitor dielectric and overlying the first electrode and defining a top capacitor electrode, part of the second conductive layer extending laterally of the first electrode over the surface of the passivation layer and contacting underlying interconnect metallization of the integrated circuit through the contact electrode formed by the first conductive layer.

13. A capacitor structure according to claim 12 wherein the capacitor dielectric comprises a ferroelectric dielectric material.

14. A structure according to claim 13 wherein the ferroelectric dielectric is selected from the group consisting of lead zirconate titanate and doped lead zirconate titanate.

15. A structure according to claim 13 wherein the ferroelectric dielectric comprises barium strontium titanate.

16. A capacitor structure according to claim 12 wherein the underlying metallization comprises an aluminum alloy.

17. A capacitor structure according to claim 12 comprising a protective layer deposited over the capacitor structure.

18. A capacitor structure for an integrated circuit, the integrated circuit comprising active devices formed on a semiconductor substrate, overlying layers comprising interconnect metallization, a top dielectric layer having bond pad openings formed through the dielectric layer for contacting the underlying interconnect metallization, and a surface passivation layer extending over the integrated circuit, the capacitor structure formed on a surface of the passivation layer and comprising:

a first conductive layer defining a first electrode, a capacitor dielectric formed on the first electrode, and an overlying second conductive layer defining a second electrode, the capacitor structure being separated from the underlying integrated circuit by the passivation layer, and, conductive interconnections from the capacitor structure to the interconnect metallization of the underlying integrated circuit being provided from the first and second electrodes of the capacitor through a plurality of conductive vias underlying the capacitor structure and defined through the passivation layer and top dielectric layer to the interconnect metallization of the integrated circuit.

19. A capacitor structure according to claim 18 wherein the first electrode comprises a conductive layer having a top surface and sidewalls, the layer of capacitor dielectric covers the surface and sidewalls of the first electrode, and the top electrode extends over the dielectric layer, thereby enclosing the capacitor dielectric.

20. A capacitor structure according to claim 18 wherein the capacitor dielectric comprises a ferroelectric dielectric material.

21. A structure according to claim 20 wherein the ferroelectric dielectric is selected from the group consisting of lead zirconate titanate and doped lead zirconate titanate.

22. A structure according to claim 20 wherein the ferroelectric dielectric comprises barium strontium titanate.

23. A capacitor structure according to claim 18 wherein the capacitor structure is a stacked capacitor comprising at least another conductive layer defining another capacitor electrode and another layer of capacitor dielectric.

\* \* \* \* \*